May 26, 1970 V. L. LAMBERT 3,513,536
METHOD OF DELINEATING P-N JUNCTIONS IN INDIUM ANTIMONIDE DIFFUSED JUNCTION DEVICES
Filed March 8, 1968
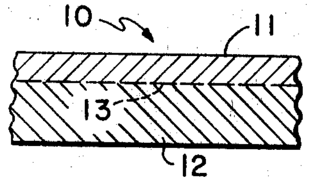
Fig 1a
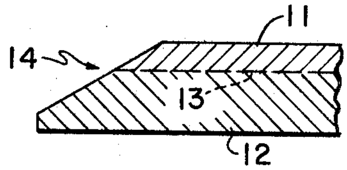
Fig 1b
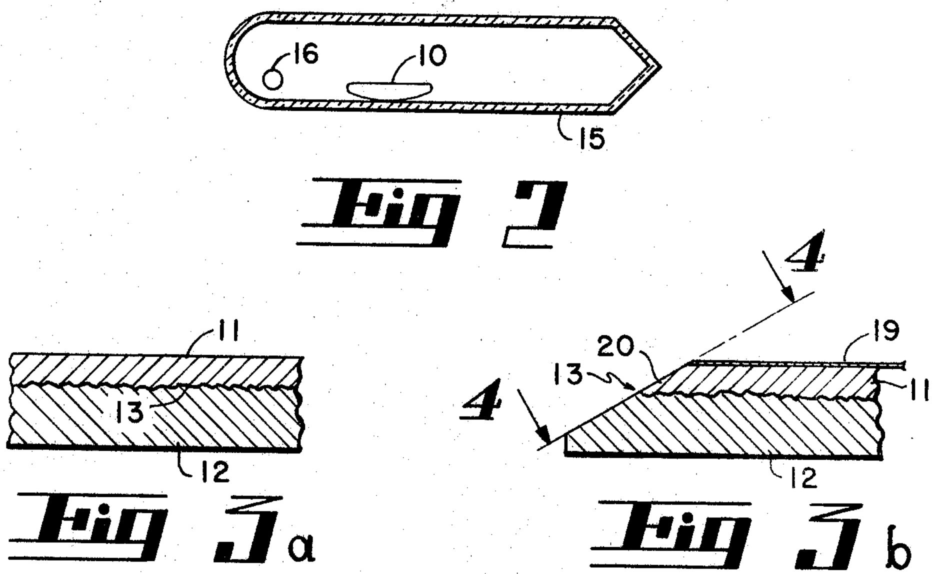
Fig 2
Fig 3a
Fig 3b
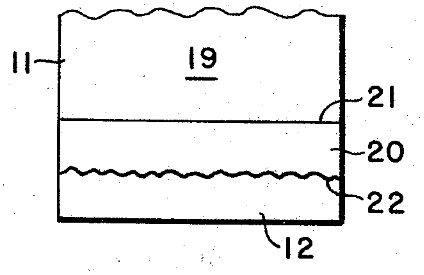
Fig 4
INVENTOR.
VERNON L. LAMBERT
BY Charles M. Hogan
ATTORNEY.

United States Patent Office 3,513,536
Patented May 26, 1970

3,513,536

METHOD OF DELINEATING P-N JUNCTIONS IN INDIUM ANTIMONIDE DIFFUSED JUNCTION DEVICES

Vernon L. Lambert, Cincinnati, Ohio, assignor to Avco Corporation, Cincinnati, Ohio, a corporation of Delaware Filed Mar. 8, 1968, Ser. No. 711,661
Int. Cl. H01l 7/00
U.S. Cl. 29—574 2 Claims

ABSTRACT OF THE DISCLOSURE

The invention comprises a method of delineating p-n junctions in photovoltaic diodes by placing a sample wafer, in which doping elements have already been diffused, in an evacuated container with a charge of a Group VI–A element, such as sulfur, selenium or tellurium, and heating the container to diffuse one of said additional elements therein, removing the diffused wafer and then bias-cutting or angle-lapping it, thereby to enable the junction to be clearly perceived visually. Measurements from this sample can be applied to other diodes derived from the batch from which the sample is taken and the p-n junctions thereby accurately located.

This invention relates to the treatment of diffused junction devices such as cadmium- or zinc-diffused indium antimonide diodes. The invention is particularly concerned with a method by which the precise location of the p-n junction in such devices can be ascertained easily and accurately from a sample so that measurements obtained therefrom can be confidently applied to devices derived from production quantities of devices identical to the sample.

In addition to the location of the junction, the quality of the junction may be readily observed, on a sample basis. By quality I refer primarily to the smoothness and lack of irregularities. This can be of extreme importance in device technology.

In the manufacture of photovoltaic devices of this type, for example, zinc- or cadmium-diffused indium antimonide wafers, for use as diodes in circuits operable in the infrared frequency band, it is necessary to determine accurately the depth to which the doping element has been diffused. Junctions at different depths—the boundary between the diffused and undiffused regions—give entirely different results when infrared energy is focused on the diffused surface. Prior art methods to delineate the junction have depended either upon probing with a narrow beam of radiant energy or upon slicing or lapping a chemically stained sample to determine the location of the junction visually. These methods have been subject to certain practical disadvantages and the latter particularly has been difficult to utilize since the delineation of the junction is often not clearly perceivable to the eye.

Another example of such methods is the use of anodization in potassium hydroxide which sometimes will delineate the junction but will not work in all cases (probably due to electrical carrier concentration effects).

According to the present invention a clearly defined visual delineation of junctions of the type described is accomplished upon a sample from which the precise location and quality of the junction can be determined for wafers derived from the production run from which the sample is taken.

A principal object of the invention is to provide an improved method by which the junction of diffused photovoltaic detectors and other InSb p-n junction devices can be made clearly visually perceivable, providing in effect a tool by which the manufacture in quantity of such devices can be facilitated.

Another object of the invention is to utilize the metallurgical capabilities of p-n junction devices to locate the exact plane of the junction between the p-type material and the n-type material, and the depth to which said junction extends.

Other objects and advantages of the invention will more clearly appear when reference is had to the following drawings, in which:

FIG. 1*a* is an enlarged cross-sectional view of a section of a zinc- or cadmium-diffused antimonide wafer manufactured according to conventional methods;

FIG. 1*b* is an enlarged cross-sectional view showing how such a wafer is bias-cut or bias-lapped in order to make the line of demarcation between the p-region and the n-region discernible;

FIG. 2 is a longitudinal section of an ampoule in which a diffused zinc- or cadmium-indium antimonide wafer is sealed with a charge of a Group VI–A element;

FIG. 3*a* is a fragmentary cross-sectional view of a wafer which has been treated in accordance with the method of the invention;

FIG. 3*b* is a fragmentary cross-sectional view of the wafer of FIG. 3*a* which has been lapped to display the clearly defined areas developed by the aforesaid method;

FIG. 4 is an enlarged side elevational view of the angle-lapped surface of FIG. 3*b* taken in the direction of the arrows 4—4 in FIG. 3*b*.

According to the invention a sample wafer 10 is taken from a batch of zinc- or cadmium-diffused indium antimonide material having a p-type region 11 and an n-type region 12 separated by a junction 13 which is difficultly perceivable when bias-cut or angle-lapped at 14, as shown in FIG. 1*b*.

According to the invention such a wafer 10 is placed in an ampoule 15, such as quartz, which has been carefully cleaned so as to be free from damaging impurities. The ampoule is charged with a small amount 16 of selenium, tellurium or sulfur. It is then evacuated to a pressure of about $10^{-5}$ mm. of mercury (torr), then sealed and heated to a temperature of about 400° C. for approximately one hour. Neither the temperature nor the diffusion time is critical. A scale forms on the surface of the wafer during this treatment but this does not militate against the value of the invention.

After diffusion the ampoule is opened and the indium antimonide wafer is angle-lapped.

During this treatment the impurity material is diffused in the region of the junction and the diffused area at the angle-lapped region clearly appears as a metallurgically delineated junction, as shown in FIGS. 3*b* and 4.

Referring to FIGS. 3*b* and 4, the top face 19 of the wafer exhibits a dull scaley appearance and the exposed area 20 of the lapped face is changed in its original appearance. It now has a metallic or silvery appearance which defines the p-type region and the junction 13 now appears as an area between a fairly well-defined surface boundary 21 and an irregular line 22. The entire area of the lapped face 20, down to line 22, thus shows up as a bright silvery area which is clearly perceivable and distinguishable from adjacent areas. The boundary 22 constitutes a metallurgical junction between the originally doped indium antimonide wafer and the newly diffused element. The irregularity in line 22 is an indication of the quality of the junction. The lapped surface of the n-type region 12 below the line 22 shows up as a dull mat-like area. Precision measurement using interferometer techniques, of the distance between boundaries 21 and 22 may be made since these boundaries are quite clearly delineated.

The invention makes possible a detailed examination of the fine structure of the p-n junction which is not revealed by conventional probing techniques nor by known methods of visual examination.

It is to be understood that wafers treated in accordance with the invention may no longer be useful as photovoltaic detectors since their function for this purpose has been modified. Accordingly, after measuring the position of the junction on the wafer and applying it to other zinc- or cadmium-diffused indium antimonide wafers or sheets to ascertain the precise location of the junction, the sample may be discarded.

It will be apparent that the method of the invention is applicable to the determination and delineation of n-p-n junctions, and p-p+-n, and n-n+ junctions and not only the extent of deviation but also the depth and quality of these junctions can be accurately determined.

Having thus described my invention, I claim:

1. The method of delineating a p-n junction comprising selecting a sample wafer of zinc- or cadmium-diffused indium antimonide material having a p-n region and an n-region, heating said wafer in an evacuated space with a small amount of a Group VI–A element, removing said sample and then bias-slicing or angle-lapping the same to expose an area thereof on an angle with its face, whereby the boundary between the respective regions is visually delineated by the appearance of a distinct bright silvery area extending between two clearly observable lines.

2. The method according to claim 1 in which the element is selected from the group comprising selenium, tellurium and sulfur.

References Cited

UNITED STATES PATENTS

| | | | |
|---|---|---|---|
| 261,511 | 7/1882 | Brown | 51—281 X |
| 3,097,458 | 7/1963 | Richmond | 51—281 |

OTHER REFERENCES

L. E. Miller: Uniformity of Junctions in Diffused Silicon Devices, pp. 303–320, Properties of Elemental & Compound Semiconductors Publ., Interscience Publishers, New York, N.Y. TK 7872 S4CS.

PAUL M. COHEN, Primary Examiner

U.S. Cl. X.R.

29—580; 51—281; 156—17